(12) United States Patent
Freytag

(10) Patent No.: US 7,193,418 B2
(45) Date of Patent: Mar. 20, 2007

(54) RESONATOR SYSTEM

(75) Inventor: Nicolas Freytag, Binz (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/150,197

(22) Filed: Jun. 13, 2005

(65) Prior Publication Data

US 2006/0017440 A1    Jan. 26, 2006

(30) Foreign Application Priority Data

Jul. 23, 2004   (DE)   ................. 10 2004 035 851

(51) Int. Cl.
*G01V 3/00* (2006.01)
(52) U.S. Cl. ...................... 324/318; 324/322
(58) Field of Classification Search ................ 324/318, 324/319, 433, 309, 307, 300, 322; 600/410, 600/422–425
See application file for complete search history.

(56) References Cited

U.S. PATENT DOCUMENTS

| 5,276,398 A | 1/1994 | Withers |
| 5,351,007 A | 9/1994 | Withers |
| 5,532,595 A * | 7/1996 | Lampman et al. .......... 324/309 |

(Continued)

FOREIGN PATENT DOCUMENTS

EP   0 347 180   12/1989

(Continued)

OTHER PUBLICATIONS

D. J. Weyers et al.: "An 8 Channel Volume RF Transmit Coil" Proc. Intl. Soc. Mag. Reson. Med. 10, 2002.

*Primary Examiner*—Brij B. Shrivastav
(74) *Attorney, Agent, or Firm*—Paul Vincent

(57) ABSTRACT

A resonator system for generating a radio frequency (RF) magnetic field in a volume under investigation of a magnetic resonance (MR) arrangement, comprises a number N of individual resonators (2) which surround the volume under investigation and which are each disposed on a flat dielectric substrate (1) around a z-axis, wherein the individual resonators (2) have windows (8) through each of which one individual RF field is generated in the volume under investigation in single operation of the individual resonators (2) and, through cooperation among the individual resonators (2), a useful RF field (7) is generated in the volume under investigation, wherein a remote RF field (6) is asymptotically generated far outside of the resonator system, and the spatial distribution of the useful RF field (7) is substantially mirror-symmetrical relative to a first plane A which contains the z-axis, and that of the asymptotic remote RF field (6) is substantially mirror-symmetrical relative to a second plane B which contains the z-axis, the useful RF field (7) extending substantially parallel to the first plane A in the volume under investigation, wherein the number of individual resonators (2) is N>4 and wherein, during operation of the resonator system at at least one point in time, the substrate plane of at least one individual resonator (2) subtends an angle of more than 40° with respect to the direction of the useful RF field (7) in the volume under investigation, and at least one further individual resonator (2) subtends an angle of less than 40° with respect to the direction of the useful RF field (7) in the volume under investigation, is characterized in that the first plane A is not rotated about the z-axis relative to the second plane B or is rotated by less than 360°/(N+1). The inventive resonator system realizes a resonator system with improved field homogeneity and full quadrature suitability, high quality factor and large efficiency using straightforward constructional measures.

24 Claims, 14 Drawing Sheets

U.S. PATENT DOCUMENTS

| | | |
|---|---|---|
| 5,565,778 A | 10/1996 | Brey |
| 5,576,622 A | 11/1996 | Morrone |
| 5,585,723 A | 12/1996 | Withers |
| 5,594,342 A | 1/1997 | Brey |
| 5,619,140 A | 4/1997 | Brey |
| 6,121,776 A * | 9/2000 | Marek .................. 324/318 |
| 6,377,047 B1 | 4/2002 | Wong |
| 6,556,013 B2 | 4/2003 | Withers |
| 6,590,394 B2 | 7/2003 | Wong |
| 6,727,700 B2 * | 4/2004 | Marek .................. 324/318 |
| 2002/0190715 A1 | 12/2002 | Marek |

FOREIGN PATENT DOCUMENTS

| | | |
|---|---|---|
| WO | WO 00/70356 | 11/2000 |
| WO | WO 2004/038431 | 5/2004 |
| WO | WO 2005/078468 | 8/2005 |

* cited by examiner

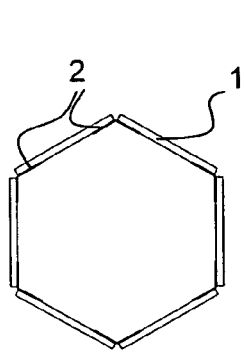
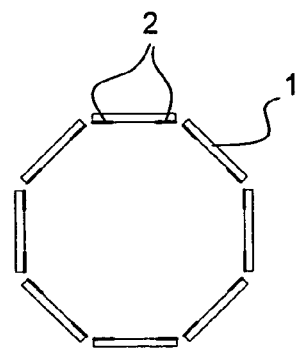
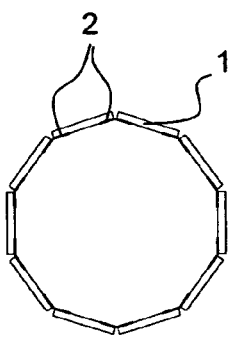
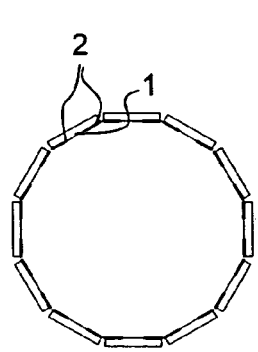
Fig. 1a     Fig. 1b     Fig. 1c     Fig. 1d
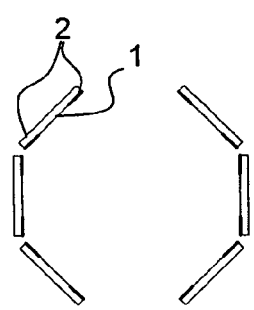
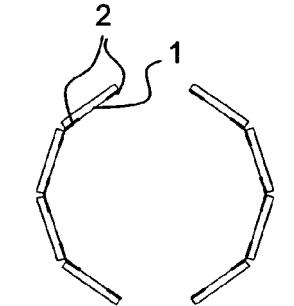
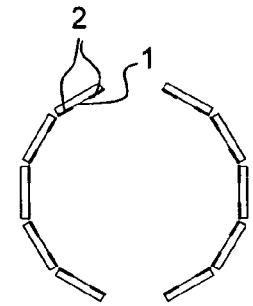
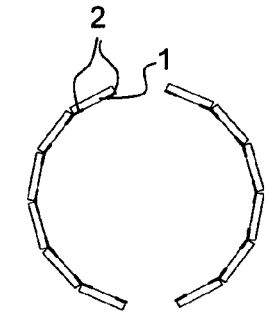
Fig. 2a     Fig. 2b     Fig. 2c     Fig. 2d
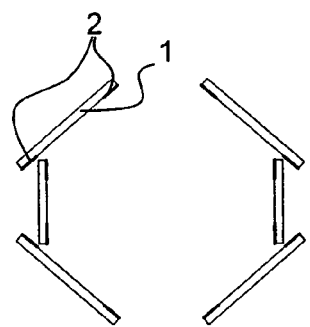
Fig. 3

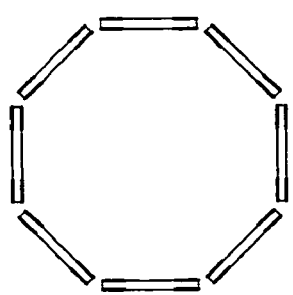
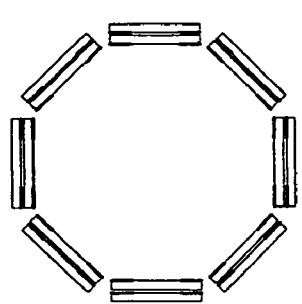
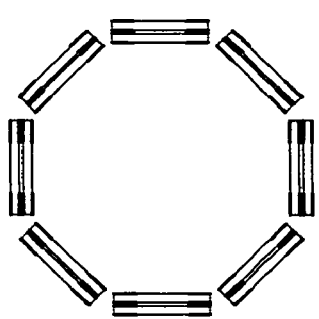
Fig. 4a  Fig. 4b  Fig. 4c
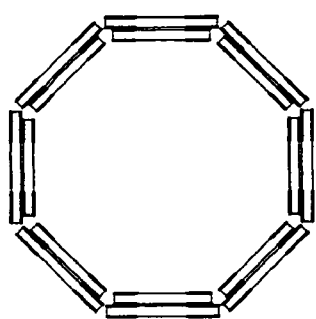
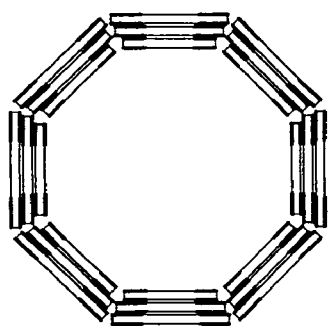
Fig. 4d  Fig. 4e  Fig. 4f
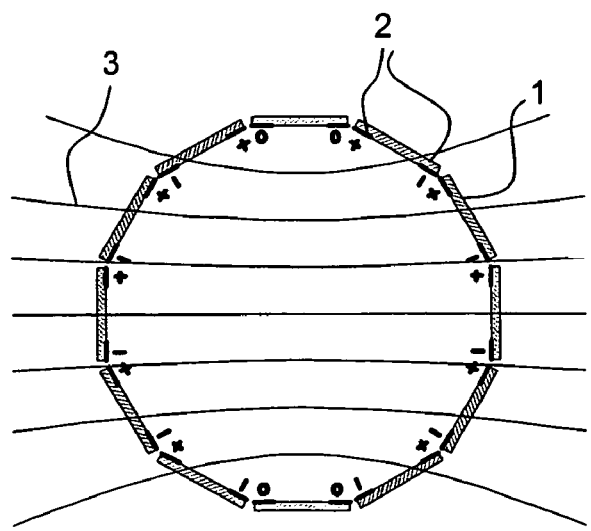
Fig. 5

RESONATOR SYSTEM

This application claims Paris Convention priority of DE 10 2004 035 851.6 filed Jul. 23, 2004 the complete disclosure of which is hereby incorporated by reference.

BACKGROUND OF THE INVENTION

The invention concerns a resonator system for generating a radio frequency (RF) magnetic field in the investigational volume of a magnetic resonance (MR) arrangement, comprising a number N of individual resonators which surround the volume under investigation and which are each disposed on flat, dielectric substrates about a z-axis, wherein the individual resonators have windows through each of which one individual RF field is generated in the volume under investigation during single operation of the individual resonators, and, through cooperation among the individual resonators, a useful RF field is generated in the volume under investigation, wherein a remote RF field is asymptotically generated far outside of the resonator system, the spatial distribution of the useful RF field being substantially mirror-symmetrical with respect to a first plane A which contains the z axis, and that of the asymptotic remote RF field is substantially mirror-symmetrical with respect to a second plane B which contains the z-axis, wherein the useful field extends substantially parallel to the first plane in the volume under investigation, and the number of individual resonators is N>4, wherein, during operation of the resonator system at at least one point in time, the substrate plane of at least one individual resonator subtends an angle of more than 40° with respect to the direction of the useful RF field in the volume under investigation, and at least one further individual resonator subtends an angle of less than 40° with respect to the direction of the useful RF field in the volume under investigation.

A resonator system of this type is disclosed in reference [9].

NMR is a very distinctive and exact method for structural analysis of chemical compounds. RF resonator systems are used to irradiate the RF pulses into the sample and to also detect radio frequency electromagnetic fields from the sample. An RF resonator system consists of one or more RF resonators which are disposed in the direct vicinity of the sample for the NMR measurement. The use of cooled and, in particular, superconducting radio frequency resonators minimizes the losses in the resonator and thereby considerably increases the sensitivity to obtain a maximum receiving sensitivity, i.e. a maximum S/N ratio.

HTS materials are currently best suited as superconductors. They have a high transition temperature and are very insensitive to static magnetic fields compared to other superconductors. These positive properties, in particular, the high critical current densities are obtained only if the superconductor consists of very thin epitactic layers which are formed on oriented single-crystal substrates, wherein these substrates are usually available only as flat plates. The geometric shape of the individual resonators cannot therefore be arbitrarily selected but must be formed from flat plates. This strongly limits the possible geometric designs.

Arrangements of this type are disclosed e.g. in references [1] to [9]. A substantial problem involved with the use of superconducting receiving resonators is the static magnetization generated by the superconductor which can produce field inhomogeneities and strongly inhibit obtaining narrow lines in high-resolution NMR. Moreover, the limited critical current in the superconductor limits the maximum coil current of the transmitting pulse and thereby complicates or prevents short pulse widths for a given NMR flip angle.

Resonator systems are conventionally operated in quadrature to effectively excite the spin system. This is only possible with resonator systems having several resonators. Towards this end, spatially rotating fields are generated, i.e. the second resonator is excited with transmitting pulses whose radio frequency phase is shifted by 90° relative to the transmitting pulses of the first resonator. The spatially rotating field thereby generated is much more efficient in exciting the spin system compared to the normal spatially stationary field. The quadrature method also produces a factor $\sqrt{2}$ of the S/N ration compared to the conventional method with only one resonator, since the noise of the two resonators is not correlated. The maximum $B_1$ excitation field (useful RF field) generated by the resonator system also increases by the factor $\sqrt{2}$. This method is particularly suited to measure large-loss samples with a high S/N ratio, e.g. salt solutions.

Irrespective of the mode of operation of the resonator system, the system should produce a $B_1$ field with optimum homogeneity and permit a second resonator to be mounted as closely as possible to the sample.

Reference [10] discloses a hybrid Birdcage resonator which is constructed from solid or slotted superconducting strip conductors 101 which are optimally disposed around the sample, parallel to the axis of the sample (FIG. 13). These strip conductors 101 are electrically interconnected via a capacitor formed at each end with a normally conducting tubular element 102. Since the strip conductors 101 are disposed very close to the sample, have a practically pure inductive effect, and must not fulfil a capacitive function, they can carry the full critical current. Due to these two reasons, the maximum $B_1$ field which can be generated in the volume under investigation obtains an optimum value and is homogeneous. Accordingly, this resonator type also permits optimum short pulse widths for a desired NMR flip angle. The highly compact construction offers optimum installation possibilities in particular for samples with large diameters which largely limit the remaining space. For small sample diameters, the somewhat complicated structure limits the geometry. These resonators are also particularly suited for operation in quadrature mode and are very efficient. The Q factor is, however, relatively small due to use of normally conducting material for the tubular elements 102. Moreover, the construction of hybrid birdcage resonators is quite demanding.

Reference [11] discloses a quadrature-suitable Birdcage resonator which is built from superconducting material only and whose bars 103 which extend parallel to the sample axis contain meandering conducting structures 104 (FIG. 14). Since the overall resonator is constructed from superconducting material, its quality factor is high. The meandering structure of the resonator additionally generates undesired electric fields which have a negative influence on the losses in conducting samples. Moreover, this arrangement has a very poor field homogeneity in the z direction, which reduces the S/N ratio, and a very low current carrying capacity, which precludes short pulse angles. The same applies if the meandering bars are not operated in self-resonant mode but are capacitively coupled via the normally conducting ring.

Reference [11] also discloses a resonator system made from a plurality of individual elements 105 which are radially symmetrically disposed about a z-axis in the form of a star (FIG. 15a). The individual elements 105 each consist of two parallel HTS layers disposed on a substrate, forming a capacitance 106. The individual substrate plates are brought sufficiently close together during assembly, such that a further capacitance 107 is formed between the HTS layers of neighboring individual resonators 105. In order to be able to neglect the additional capacitances 107, such that the resonance frequency is only provided by the capacitances 106 defined between the electrodes, the separations would have to be in the micrometer range. However, this is technically not possible. FIG. 15b shows an equivalent diagram of such a resonator system. The capacitor drawn on a large scale represents the capacitance 107 between neighboring individual resonators 105 and is thereby given by the air/vacuum gap 108. The small capacitor represents the capacitance 106 between the electrodes of a substrate. The dots in FIG. 15b symbolize more bars with corresponding capacitors mounted to both sides. The structure is closed, i.e. the left-hand edge is capacitively connected to the right-hand edge. When the resonator system resonates, current can flow from one individual element to the next through the capacitors at the ends of the individual elements. The current in the "loops" at the top and bottom is defined as an effective displacement current in the capacitors 106, 107. Combination of the capacitors 106, 107 produces the equivalent diagram of FIG. 15c, illustrating a conventional high-pass Birdcage resonator. The field distribution of this arrangement in the xy plane is shown in FIG. 15d.

References [1]–[8] disclose Helmholtz resonators which have a very high quality factor due to the exclusive use of HTS material. With appropriate geometrical arrangement (positioning two conductors 109 at an angle of 120° as shown in FIG. 16), this arrangement can obtain relatively good field homogeneity. The efficiency is however small, since the current carrying elements are located remote from the sample. Moreover, the conventional arrangements require a large amount of space. For this reason, resonators for further frequencies are located considerably further away from the sample or cannot be mounted at all due to lack of space. Another disadvantage is that these devices are quadrature-suitable to only a limited degree, namely only if the conductors 109 are disposed at an angle of less than 90°.

Reference [9] discloses "Twin-V" resonators which are composed of several identical individual resonators 111 mounted onto planar dielectric substrates 110 (FIG. 17). With a given current through the resonance circuit, this device generates an optimally large $B_1$ field at the center of the volume under investigation 112, wherein the direction of the $B_1$ field extends approximately parallel to the plane of the substrate 110 and the parallel displacement should not exceed 40°. In addition to the high quality factor and the good field homogeneity of the above-described resonators, a relatively good efficiency is realized. Disadvantageously, this arrangement can only be used for small samples and generates a large stray field which produces strong coupling with other resonators. Moreover, in the embodiment shown in FIG. 17, the arrangement can only be operated in a linearly polarized mode.

Reference [9] also discloses use of arrangements with components 113 comprising several individual resonators to also generate spatially rotating fields. An arrangement of this type is shown in FIG. 18a. The components 113 are disposed around an axis in the shape of a wind wheel. FIG. 18b shows the magnetic field 114 (individual RF field) generated by one individual resonator. Only part of the individual RF fields of the individual resonator, in the present case the field 114 generated by the current (+), is used to generate the useful RF field in the volume under investigation 112. The field 115 generated by the counter current (−) on the other side of the individual resonator is disposed as far away from the sample as possible to prevent cancellation or unnecessary disturbance of the useful RF field. The rotating field can be generated more efficiently by using n components 113 which are designed as shown in FIG. 18a and which are symmetrically disposed about the volume under investigation 112. A component 113 is disposed such that the conductor 116 lies perpendicularly over the center of the volume under investigation 112. Subsequent to the first component 113, n−1 further identical components 113 are added, wherein these are rotated about the longitudinal axis of the volume under investigation 112 by 360°/n, relative to the first. A rose like, symmetrical structure is obtained for exciting a rotating field. FIG. 18c shows an arrangement of this type comprising eight individual resonators disposed on components 113. The remote RF field of such resonator systems has a symmetry plane B which is rotated relative to the symmetry plane A of the useful RF field by an angle 360°/n, i.e. by 45° in the example of FIG. 18c. If more individual resonators are used, the angle becomes smaller and smaller. N>8–10 can hardly be realized for high-resolution NMR coils due to the geometry (as explained in reference [9]), such that, in practice, the angle of the remote field is rotated relative to the useful RF field by more than 36°. A result of this rotation of the useful RF field relative to the remote RF field is that the mounting and, in particular, inductive coupling of further resonators for additional frequencies in such a manner that the coupling between the resonator system and the further resonators can be neglected, is extremely difficult. It should also be noted that the resonator system contains a field (individual RF field) which is considerably higher than the useful RF field. This embodiment requires even more space than an arrangement with Helmholtz pairs such that the resonators for further frequencies are located at a considerably greater distance from the sample or cannot be mounted at all due to lack of space.

As has been shown, all conventional resonator types have some serious disadvantages.

It is the object of the present invention to further develop the resonator system of [9] to realize high efficiency, full quadrature suitability and good field homogeneity with a simple and compact structure.

SUMMARY OF THE INVENTION

This object is achieved in accordance with the invention by a resonator system with which the first plane A is not rotated relative to the second plane B or is rotated by an angle of less than 360°/(N+1).

Optimally, the first plane A is not rotated relative to the second plane B such that the remote RF field faces in the same direction as the useful RF field or the remote RF field is rotated by 180° relative to the useful RF field. Rotation of the plane A relative to the plane B by less than 360°/(N+1) thereby corresponds to rotation of the remote RF field relative to the useful RF field by an angle α, wherein α<360°/(N+1) (case 1) or by an angle α, wherein 180°<α<180°+360°/(N+1) (case 2). In the first case of the inventive resonator system, the angle between the planes A and B is deliberately kept smaller than 360°/(N+1) to ensure that the useful RF field is of the same magnitude as the individual RF fields to obtain a resonator system having a high efficiency. In the arrangements of the second case, i.e. the angle between the planes A and B is between 180° and 180°+360°/(N+1), and the individual RF fields are considerably larger than the useful RF field. These arrangements provide flexibility for active outward shielding of the RF field.

In a preferred embodiment of the present invention, the individual resonators contain superconducting material which produces a high quality factor.

In a particularly preferred embodiment, the individual resonators are exclusively constructed from superconducting material except for the dielectric substrates and an optional normally conducting metallic quench protection layer. This is particularly advantageous since high currents flow in the inventive device and the losses produced can be minimized by the structure of the resonator system.

In one embodiment of the invention, the individual resonators or groups of individual resonators are disposed about the z-axis in two-fold rotational symmetry. This arrangement is particularly suited for operation of the resonator system in a linearly polarized mode.

In a particularly simple arrangement, the number of the individual resonators is $N=2(i+2)$, wherein i is a natural number.

In an alternative embodiment of the inventive resonator system, the individual resonators are disposed about the z-axis corresponding to their number N, in an N-fold rotational symmetry.

In a further development of this embodiment, the number of individual resonators is $N=4(i+1)$, wherein i is a natural number. This arrangement facilitates operation of the resonator system mainly in the circularly polarized mode, since it permits coupling at 90° with a corresponding phase shift.

In an advantageous embodiment of the inventive resonator system, the individual resonators are disposed on the surfaces of a polyhedron. The individual resonators can be disposed such that they partially eliminate the currents flowing upwards and downwards. The resulting current distribution is characterized by the differential currents of the individual resonators. This arrangement requires the least space compared to all arrangements presented herein and can be realized with the simplest technical means.

In a further embodiment, the individual resonators are disposed such that the surface normals of the substrates have a tangential component. The individual resonators may thereby partially overlap such that conductors with opposite currents are behind each other. This is the most effective arrangement to form differential currents in a minimum amount of space and producing a particularly high homogeneity of the useful RF field.

In a special embodiment of the inventive resonator system, the individual resonators are disposed radially outwardly like a star such that the surface normals of the substrates are tangentially oriented. In this arrangement, the full periphery of the sample to be measured is available for the current carrying conductors. Particularly short pulse angles can thereby be obtained. This arrangement is also suited for active shielding of the RF fields.

Spiral resonators and/or resonators having distributed capacitances and/or resonators with localized capacitances and/or double-sided resonators may be provided as individual resonators in the inventive resonator system. The resonator shape can be selected irrespective of the respective application.

Several individual resonators are advantageously disposed along the z direction for active shielding of the generated RF magnetic field in the z direction. The current distribution in the z direction can thereby be modelled.

In a particularly advantageous manner, several individual resonators are nested in a radial direction in an xy plane perpendicular to the z direction for active shielding of the generated RF magnetic field. This can be realized in the simplest manner using a star-shaped arrangement.

In a particularly advantageous embodiment, several substrates provided with one or more individual resonator(s) are stacked or nested in the z-direction and/or in a radial direction. In this manner, a relatively large resonator system can be constructed using small substrates and correspondingly small individual resonators.

In a further embodiment of the inventive resonator system, at least one of the individual resonators has a different resonance frequency than the other individual resonators. This permits construction of a resonator system with two linearly polarized modes having different frequencies, which can be used to measure two different nuclei.

The individual resonators are preferably inductively and/or capacitively and/or galvanically coupled.

An advantageous resonator system may consist of a combination of the above-described resonator systems and conventional normally conducting and/or superconducting individual resonators and/or resonator systems.

The present invention also concerns a method for adjusting the eigen-resonances of the individual resonators of an above-described resonator system, comprising the following steps:
 a) design of an arbitrary resonator system;
 b) calculation of the currents $I_0$ which permit maximum field homogeneity in the volume under investigation with a given geometrical arrangement of the individual resonators;
 c) calculation of the current distribution in the resonator system and of the magnetic field in the volume under investigation for the desired resonance mode;
 d) calculation of the average currents in the conductor elements of the individual resonators;
 e) correction of the eigen-resonances of the individual resonators, wherein these changes should be largely proportional to the respective deviation of the currents from the values $I_0$;
 f) repeating steps b to e until maximum homogeneity of the magnetic field in the volume under investigation is obtained.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

BRIEF DESCRIPTION OF THE DRAWING

FIGS. 1a–d show sectional views in the xy plane of geometries for resonator systems in accordance with the present invention with N-fold rotational symmetry;

FIGS. 2a–d show sectional views in the xy plane of geometries for resonator systems in accordance with the invention with 2-fold rotational symmetry;

FIG. 3 shows a sectional view in the xy plane of a geometry for a resonator system in accordance with the present invention with a 2-fold rotational symmetry and individual resonators of different sizes;

FIGS. 4a–f show sectional views in the xy plane of geometries for resonator systems in accordance with the present invention with nested individual resonators;

FIG. 5 shows a schematic view of the current directions and the magnetic field in the xy plane for a resonator system with a geometry like FIG. 1d;

FIG. 8b shows a schematic view of the remote RF field and the useful RF field in the xy plane for a resonator system with a geometry in accordance with FIG. 8a;

FIGS. 15b,c show equivalent diagrams for a superconducting Birdcage coil according to FIG. 15a;

FIG. 15d shows a schematic illustration of the magnetic field in the xy plane for a superconducting birdcage coil according to FIG. 15a;

FIG. 18c shows a schematic illustration of the remote RF field and the useful RF field in the xy plane of a resonator system in accordance with FIG. 18a.

DESCRIPTION OF THE PREFERRED EMBODIMENT

Figure 6:
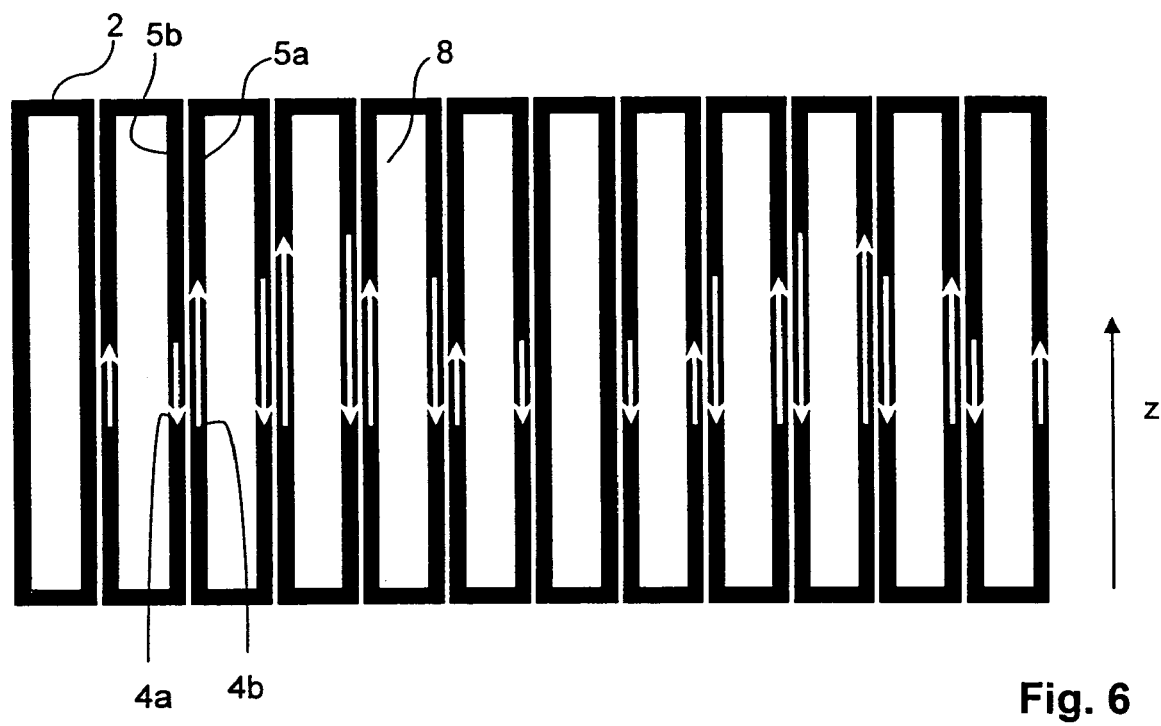
FIG. 6 shows a current distribution of a resonator system where the periphery is unrolled in this illustration.

FIGS. 1a–d and FIGS. 2a–d show sections of different embodiments of an inventive resonator system parallel to the xy plane. N=4(i+1) individual resonators 2 disposed onto planar substrates 1 (FIGS. 1b, d and FIGS. 2b, d) are preferably symmetrically disposed about a sample. A number of N=2(i−2) individual resonators 2 is also reasonable for linearly polarized coils.

FIGS. 1a–d show resonator systems, wherein the individual resonators 2 are disposed on the surfaces of a polyhedron. The illustrated embodiments have an N-fold rotational and planar symmetry and are more suited for circularly polarized coils (quadrature emission and detection), whereas the embodiments shown in FIG. 2 merely show a 2-fold rotational and planar symmetry and are therefore only suited for linearly polarized coils.

As shown in the example of FIG. 3, the size of the individual resonators 2 must not be identical. It is however useful to respect at least one, optimally both symmetry planes of the system and therefore provide all individual resonators 2 in pairs or groups of four.

To increase the current-carrying capacity of the resonator system, several individual resonators 2 can be stacked or nested, wherein for linearly polarized resonator systems (FIGS. 2a–d, FIG. 3) merely the "critical" ones need to be reinforced. Towards this end, structures which are superconducting on both sides can be disposed onto a substrate 1 (FIG. 4a) or substrates 1 provided on one side with individual resonators 2 can be stacked (FIG. 4b). Moreover, substrates 1 provided on both @sides with individual resonators 2 can be nested (FIGS. 4c–f). If the individual resonators 2 are doubled, the eigen-frequency of the resonator system is reduced by approximately $\sqrt{2}$. This may be utilized to obtain a lower resonance frequency than the resonance frequency which can be obtained with simple resonator systems due to their geometrical limits. Stacking may also be used to trim the resonator systems by stacking individual resonators 2 having slightly different resonance frequencies.

FIG. 5 exemplifies the current directions (+: current flows upwardly, −: current flows downwardly) in the conductor paths of the individual resonators of an inventive resonator system and some field lines 3 at a time $t_0$. If the field of the resonator system is linearly polarized, the (+) current directions and the (−) current directions through the resonator loops alternate during a phase. The two individual resonators 2 which are perpendicular to the magnetic field never carry any current. If a circularly polarized field is generated, all individual resonators carry current over one period. At the times $t_i = t_0 + (i\pi/6)/f$, the representation of FIG. 5 can be rotated in 30° in intervals. The (+) current and also the (−) current of each individual resonator extend as closely as possible to the sample such that both current directions contribute to the useful RF field, wherein the two resonators generate opposite fields which are partially mutually cancelled. This cancellation is better the smaller the distance of the current-carrying conductors. It should be considerably smaller than the separation from the sample to be measured to obtain high field homogeneity.

The spatial current distribution of the inventive resonator system is very similar to the current distribution of a conventional Birdcage resonator (BC). In contrast to a conventional Birdcage resonator, wherein the individual bars 103 each carry a certain current, this current is divided into two currents in the inventive resonator systems described up to now: a current 4a which flows upwards in the (+) direction, and a current 4b which flows downwards in the (−) direction. In the inventive resonator system, the nodes and meshes are distributed in accordance with the Kirchhoff rules in such a manner that each mesh is separated and the nodes are eliminated. FIG. 6 schematically shows the individual resonators 2 and the associated currents 4a, 4b at a time $t_0$. The z axis faces upwards. The outer right individual resonator is followed by the outer left (the periphery is unrolled in the illustration). The differential currents produce an overall largely sinusoidal current distribution over the pairs of conductor sections 5a, 5b of the individual resonators 2. The current distribution is almost identical to that of a conventional BC. Clearly, the amount of current that flows in the resonator system is, in principle, excessively large which, at first glance, produces unnecessary losses. The resonator system contains differential currents which are on the order of magnitude of the currents of a conventional BC, and the currents 4a, 4b flow upwards and downwards, such that they may each be considerably higher than the differential current (maximally approx. one quarter of the sum of the currents over all bars of a conventional BC). This would produce very high losses with normally conducting individual resonators. For individual superconducting resonators of the type used herein, the intrinsic quality factors are sufficiently high that measures must in any event be taken to force the quality factors down to values which are "useful" for magnetic resonance measurements. The additional losses through the partially compensating currents are therefore not important and can be neglected.

x

If the individual resonators are identical, the desired (sinusoidal) current distribution is automatically obtained by the inductive coupling. Should the current distribution be changed e.g. due to limitation by critical currents, only the resonance frequencies of the corresponding individual resonators 2 must be increased (either through reduction of the inductance L—smaller loops, or of the capacitance C—fewer overlappings) or reduced. The inventive resonator system therefore permits arbitrary straightforward adjustment of the current distribution on the individual resonators for linearly polarized coils. With circular polarization, all individual resonators 2 should be identical for reasons of symmetry.

A coil with resonators having different resonance frequencies can be designed such that the resonator system has two orthogonal, linearly polarized modes with different resonance frequencies. Resonance frequencies of nuclei with maximum closeness are particularly suited to maintain good field homogeneity of the two modes. Pairs of such nuclei are e.g. $^1$H and $^3$H, $^1$H and $^{19}$F, or $^{13}$C and $^{23}$Na, $^{63}$Cu or $^{65}$Cu etc. In particular, the variants of the invention of the type of FIGS. 1b, 1d etc. and also of the type of FIG. 8 or 9 are suited for such a resonator system.

The basic difference with respect to all conventional Birdcage resonators is that the inventive resonator system is designed from individual resonators which carry a "circular current", without tubular or annular elements 102 which could carry the current from one bar 103 of the resonator to another, i.e. there is no capacitive coupling between the individual resonators 2 in the inventive resonator system.

Figure 7:
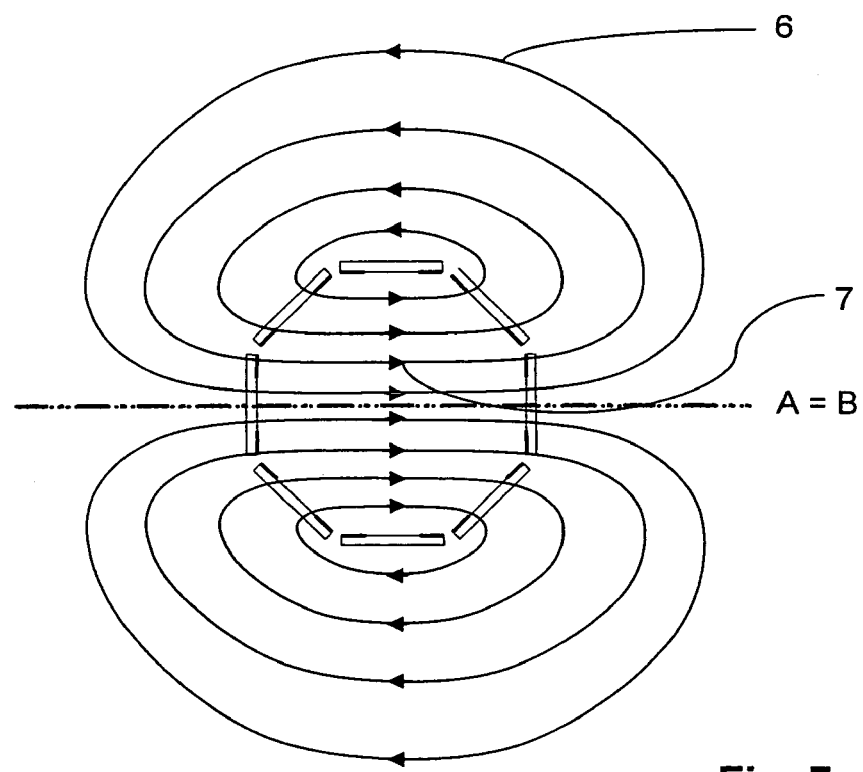
FIG. 7 shows a schematic view of the remote RF field and the useful RF field for a resonator system with a geometry in accordance with FIG. 1b.

FIG. 7 shows the field distribution of the remote RF field 6 and the useful RF field 7 for a resonator system with a geometry in accordance with FIG. 1b. The spatial distribution of the useful RF field 7 relative to a first plane A which contains the z-axis, and that of the asymptotic remote RF field 6 relative to a second plane B which contains the z-axis are each substantially mirror symmetrical. The useful RF field 7 extends substantially parallel to the first plane A in the volume under investigation. It is clear that the first plane A coincides with the second plane B and the useful RF field extends in an opposite direction to the remote RF field. The useful RF field is thereby rotated by 180° relative to the remote RF field. The design of an MR probe head with further resonators for additional frequencies is thereby considerably facilitated. A second resonator system can be disposed such that it is perpendicular to the first, wherein the inner resonator system can still be e.g. inductively coupled in a simple manner without producing noticeable coupling with the outer resonator system. This is not the case if the planes A and B are mutually rotated.

Figure 8A:
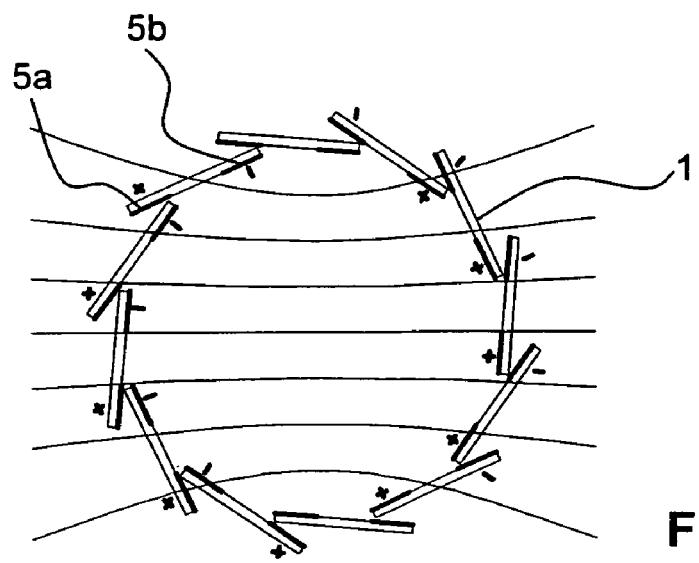
FIG. 8a shows a schematic view of the current directions and of the magnetic field in the xy-plane for a resonator system with offset individual resonators.
Figure 8B:
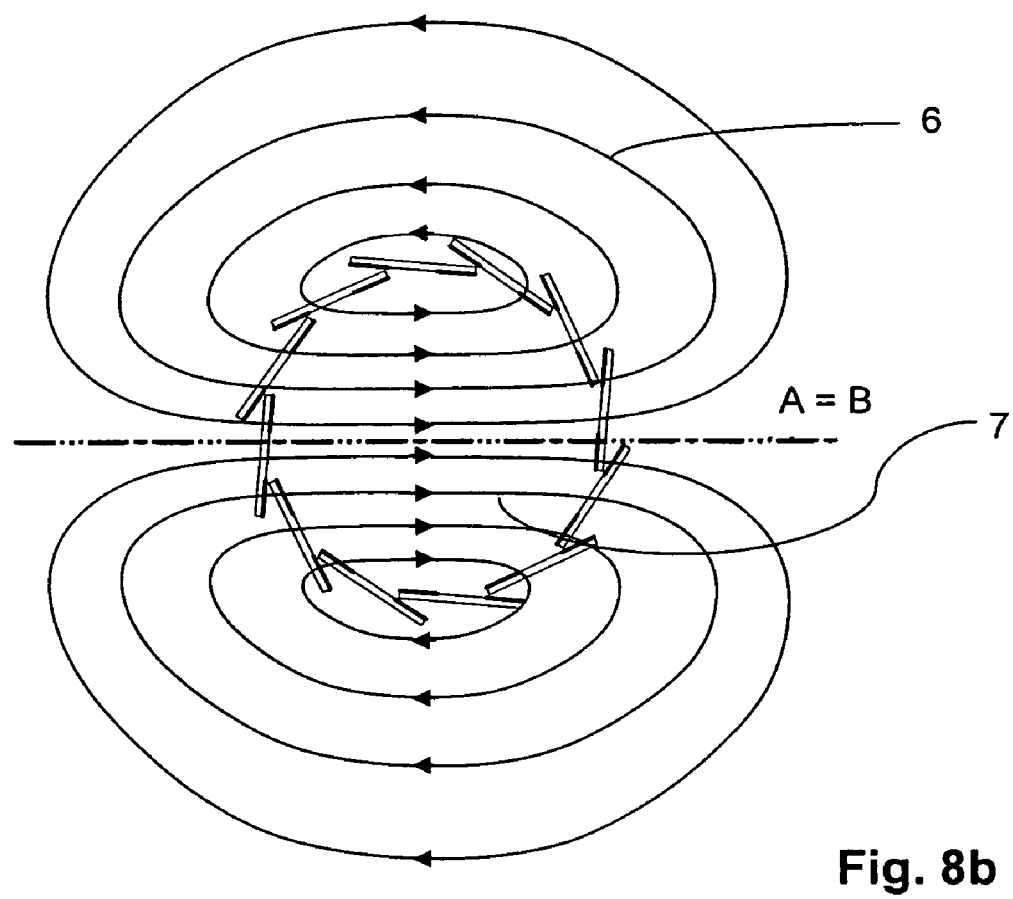

In the embodiments of FIGS. 1, 4, 5 and 7, the individual resonators 2 are disposed on the surfaces of polyhedrons. This is not absolutely necessary and, in principle, other geometries are also possible. FIG. 8a shows e.g. a geometry wherein the surface normals of the substrates 1 have a small tangential component. The substrates 1 are disposed to overlap such that the currents 4a, 4b in the conductor sections 5a, 5b disposed "behind" each other partially cancel. This embodiment presents one possible structure of an inventive resonator system with which the useful RF field is particularly homogeneous since the differential currents are formed in a minimum amount of space. FIG. 8b shows a schematic representation of the associated field distribution of the remote RF field 6 and of the useful RF field 7, thereby neglecting local field distortions in the vicinity of the "bars" of the resonator system. The illustration shows that, as in the example of FIG. 7, the planes A and B are also not mutually rotated in this case. The principle remains the same as in the above-described embodiments. The field lines shown in FIG. 8b neglect the local field distribution in the vicinity of the current paths. The above illustrations apply until the current carrying conductors are sufficiently close to each other that the field in the space between them is not substantially larger than the useful RF field. Only when this latter field has the same magnitude as the useful RF field does the remote RF field begin to substantially rotate relative to the useful RF field.

Figure 18A:
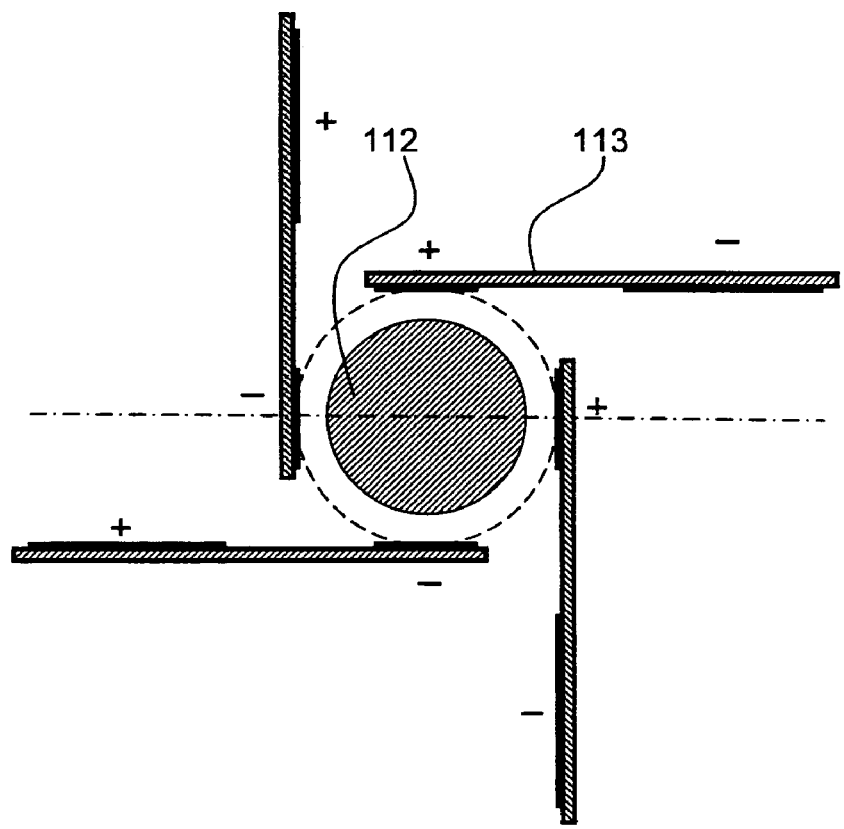
FIG. 18a shows a resonator system in a displaced plane parallel arrangement in accordance with prior art.
Figure 18B:
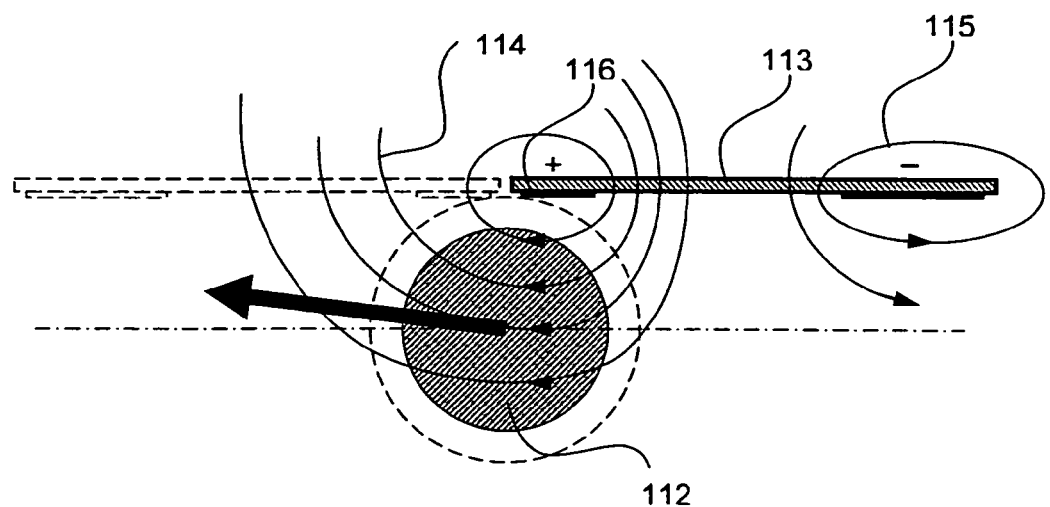
FIG. 18b shows a resonator system according to FIG. 18a with schematically illustrated magnetic field and current directions of an individual resonator in the xy plane.
Figure 18C:
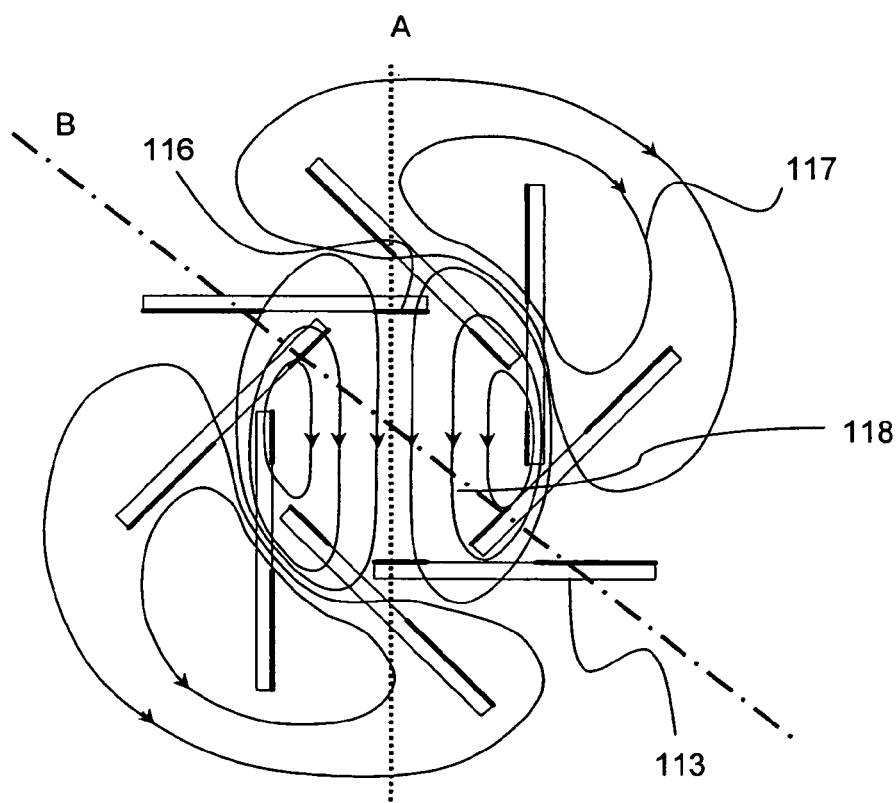

The inventive resonator system differs from the conventional resonator system (FIGS. 18a–c) in that the currents 4a in (+) direction and the currents 4b in (−) direction extend closely to each other such that they partially mutually cancel. In contrast to conventional resonator systems, the differential currents are decisive. While the principle of the resonator system shown in FIG. 18a consists in moving the "disturbing" currents, which correspond to the currents 4b in the inventive resonator system, as far away as possible from the sample, the formation of differential currents is utilized in the above-described inventive resonator systems. This becomes obvious in particular through regarding the field distributions of the useful RF field 7 and of the remote RF field 6 of the two resonator systems. While the planes A and B of the conventional resonator system are mutually rotated (FIG. 18c), the planes A and B of the inventive resonator system shown in FIGS. 7 and 8b coincide.

Figure 9A:
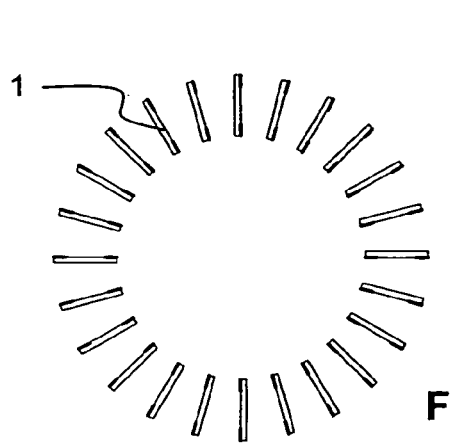
FIG. 9a, b show sectional views in the xy plane of geometries for resonator systems in accordance with the present invention with radially outwardly facing individual resonators.
Figure 9B:
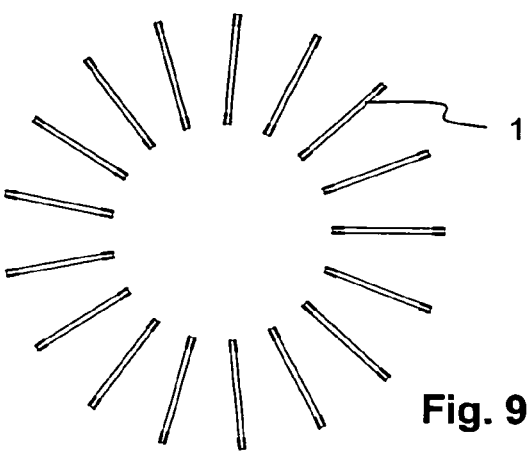
FIG. 9c shows a schematic view of the remote RF field and of the useful RF field in the xy plane for a resonator system with radially outwardly facing individual resonators.
FIG. 9d shows an equivalent diagram for a resonator system according to FIGS. 9a–c.
Figure 9C:
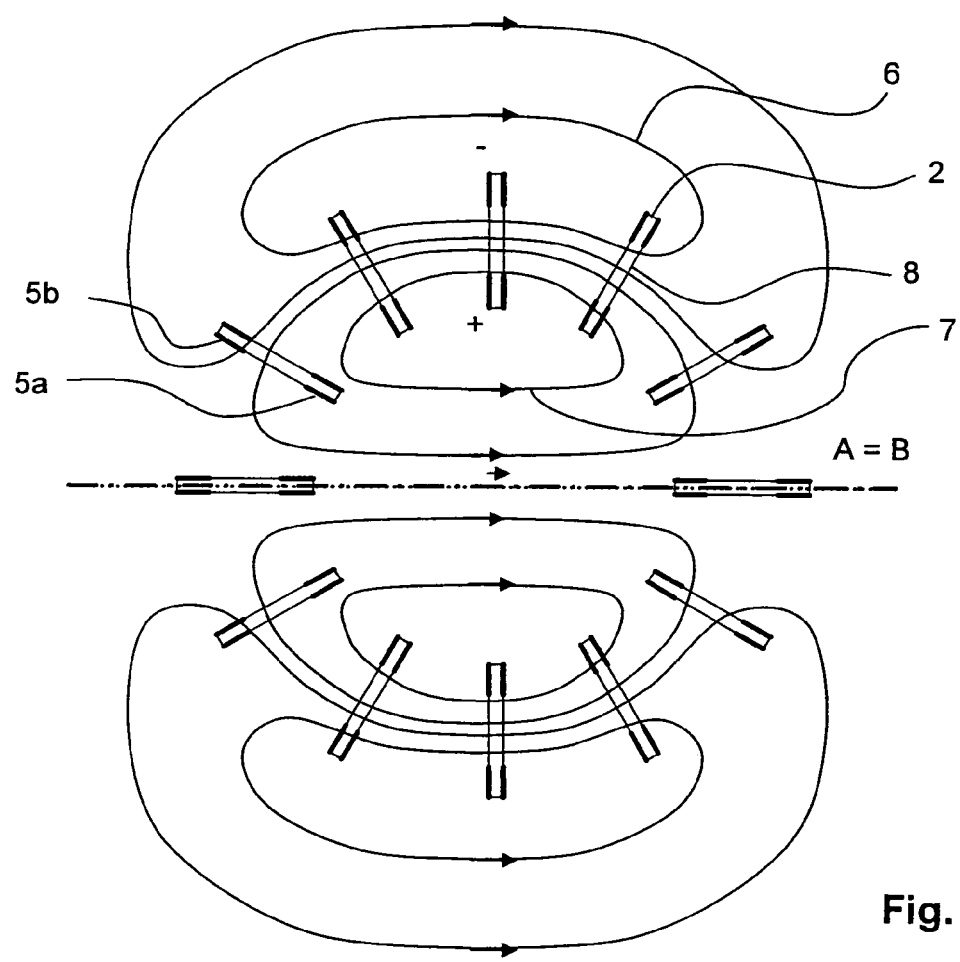

One further possible construction of an inventive resonator system is shown in FIGS. 9a–c. In these star-shaped arrangements, the currents 4a, 4b do not cancel each other. The conductor sections 5a of FIG. 9c in which the currents flow in (+) direction are disposed radially inwards while the conductor sections 5b in which the currents flow in (−) direction are outwardly displaced. The field which prevails in the center of the resonator system is highly compressed in the outer region by the individual resonators 2. The relevant currents of such arrangements are located somewhat further away from the sample and require more space. However, the current-carrying capacity of this "star-shaped" resonator system can be considerably increased compared to an arrangement in accordance with FIGS. 1–8 by increasing the number of individual resonators 2.

Although the inventive resonator system of FIGS. 9a, b resembles, at first glance, the Birdcage arrangement (FIG.

Figure 15A:
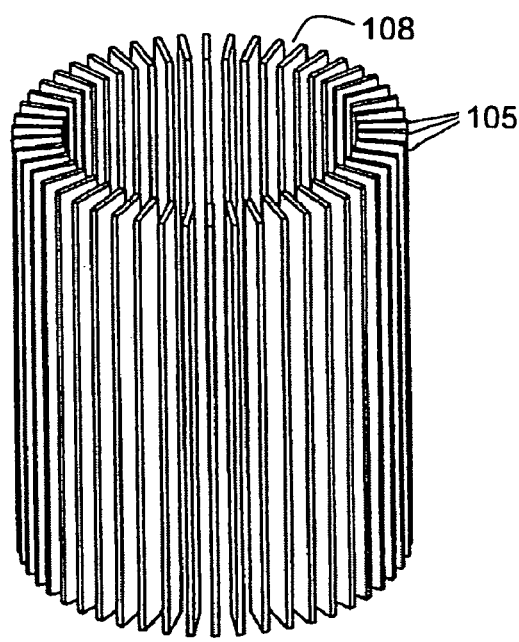
FIG. 15a shows a purely superconducting birdcage coil consisting of a plurality of individual elements in accordance with prior art.
Figure 15B:
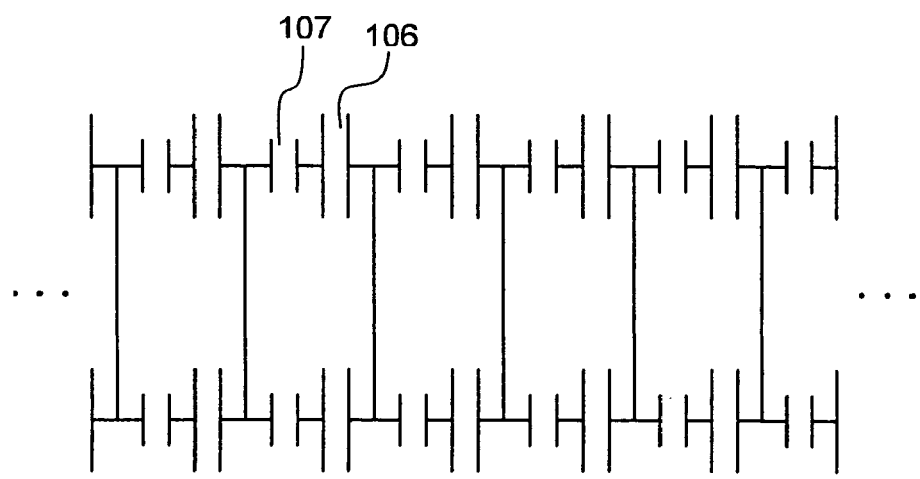
Figure 15C:
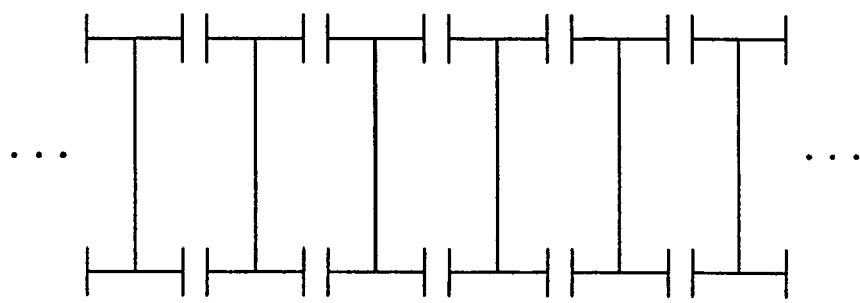
Figure 15D:
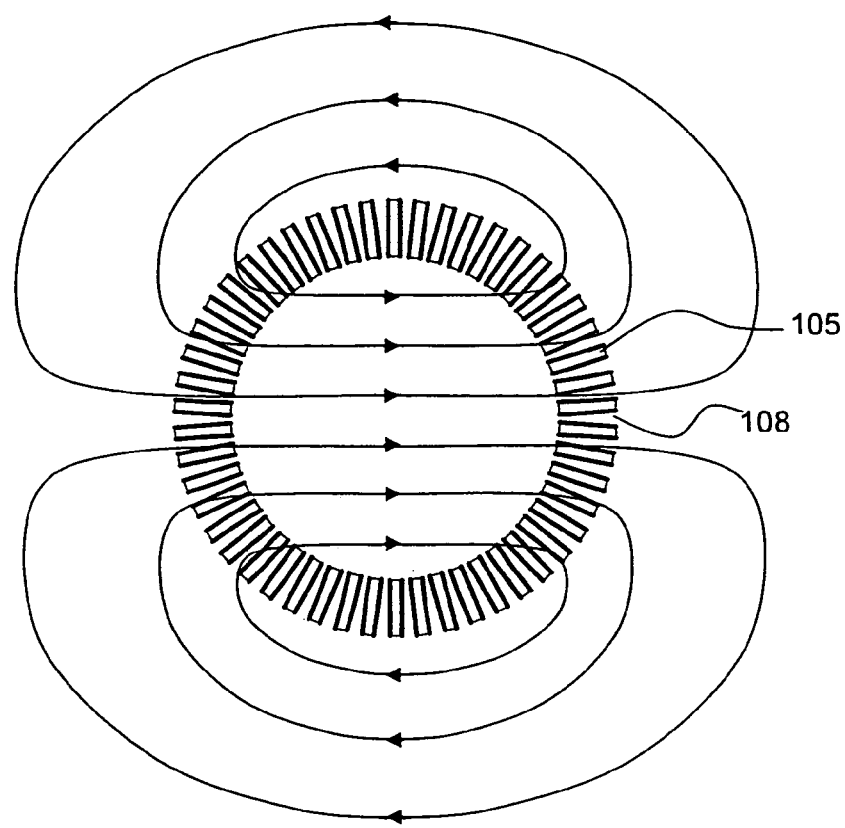
Figure 16:
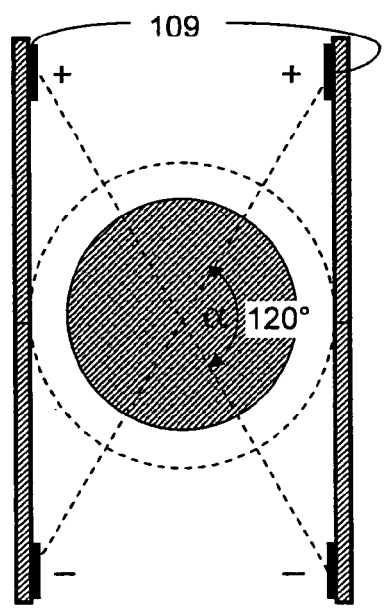
FIG. 16 shows a Helmholtz resonator in accordance with prior art.
Figure 17:
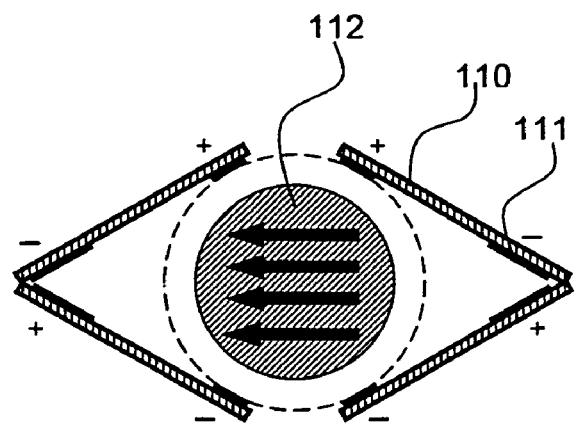
FIG. 17 shows a "Twin-V" resonator in accordance with prior art.

15a) constructed from individual resonators 105 disclosed in reference [11], the field distribution of the inventive resonator system is clearly different from that known from literature. FIG. 9c shows the associated field distribution for the inventive resonator system with remote RF field 6 and the useful RF field 7. In the star-shaped arrangements shown herein, the remote RF field 6 in the outer space of the resonator system faces in the same direction as the useful RF field 7 in the resonator center. This is exactly reversed in the Birdcage arrangement known from [11] (FIG. 15d). This "anomaly" is due to the fact that, in the inventive resonator system, a complete annular current flows through the individual resonator 2 on each substrate 1. The current directions for an individual resonator 2 are marked by (+) and (−) in FIG. 9c. A current 4a flows upwards (+) inside the resonator system, a current 4b flows downwards (−) in the outer region of the resonator system thereby generating a field proximate the windows 8 and in the intermediate space of the individual resonators 2. In contrast thereto, no annular currents flow in the resonator system of FIG. 15a such that, with the field distribution shown in FIG. 15d, the remote RF field extends opposite to the useful RF field in the center of the resonator system.

Figure 9D:
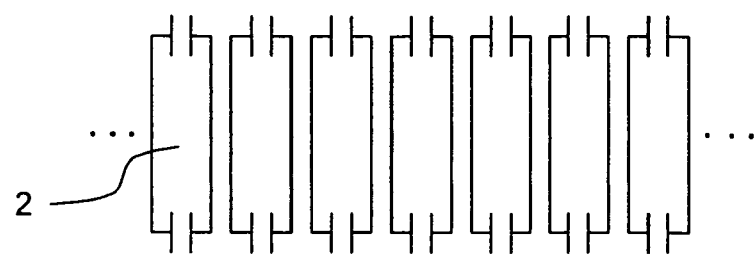

This is a substantial difference between the inventive resonator system and the conventional ones. In the inventive resonator system, one individual resonator 2 is defined on each substrate 1, which has substantially the same current distribution during operation as during operation of an individual resonator 2 per se—i.e. a "circular current". The resonance frequency thereby remains close to the original resonance frequency. FIG. 9d shows the equivalent diagram for the star-shaped resonator systems shown in FIGS. 9a, b. In contrast to the conventional arrangement of FIG. 15a with associated equivalent diagrams FIGS. 15b, d, in the inventive resonator system, ideally no current flows from one individual resonator 2 to the next, in resonance. In reality, there are of course small stray capacitances between the individual resonators 2 which may provide very small current transfer from one individual resonator 2 to the next. These are at least 50 times smaller than the capacitances within the individual resonators 2 in all practical realizations merely due to the differences in the dielectric constants of the materials of the individual resonators 2 (sapphire, magnesium oxide or lanthanum aluminate) compared to that of vacuum.

The difference between the embodiment of the inventive resonator system of FIGS. 9a, b compared to the conventional Birdcage resonator system (FIG. 15a) is obvious also in that the modes do not consist of a sequence of a conventional high- or low-pass Birdcage but are grouped in another order, i.e. not "linear, quadrupole, octupole . . . " or ". . . , octupole, quadrupole, linear" but "quadrupole, linear, octupole".

Each of the described embodiments of the inventive resonator system, in general of course also the individual resonators 2 disposed on polyhedral surfaces, can be produced with any number N of individual resonators 2, with N also possibly being an odd number, in particular if operated in the quadrature mode (with circularly instead of linearly polarized magnetic field).

Figure 10A:
FIG. 10a shows a section of a resonator system with several individual resonators disposed behind each other in the z-direction with schematically shown current and magnetic field directions.

Generally, the Kirchhoff rule separation method also permits generation of arbitrary field distributions in the z-direction. The global current distribution can be modelled with relatively high precision by dividing the space into a large number of small loops (compensation coils 9) (FIG. 10a), which also permits e.g. very steep cutting-off of the useful RF field 7 in the z-direction. This corresponds to active shielding of the coil in the z-direction.

Figure 10B:
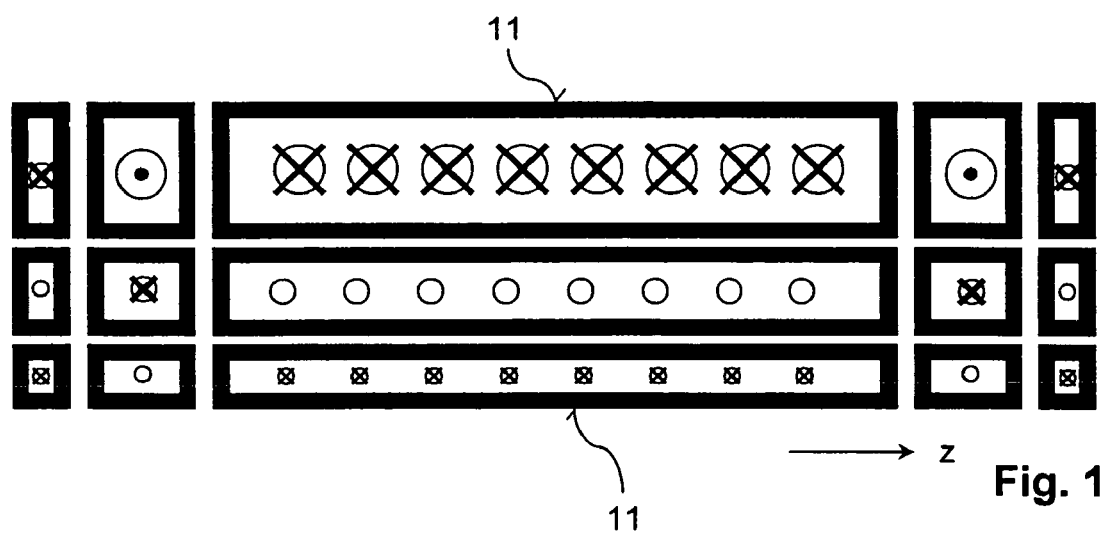
FIG. 10b shows a section of a resonator system with several individual resonators disposed behind each other in the z and radial directions with schematically shown magnetic field directions.

The same method can also be used, in particular, with the arrangement of FIG. 9 in the xy-plane, which is nevertheless quite complex. In addition to the main resonator, in the arrangement of e.g. FIG. 7 or 8a, a plurality of compensation coils 9 can be arranged in the z-direction and in a radial direction. This is schematically shown in FIG. 10b as an example for a resonator system in accordance with FIGS. 9a, b. The upper edge 10 of the section shown in FIG. 10b faces the center of the resonator system. The lower edge 11 faces outwards. The symbols characterized with dots or crosses show the direction of the magnetic field generated by the resonator system. A coil which is completely constructed from superconductors and has a negligibly small stray field may, in principle, be constructed. This is, in particular, a very effective method to provide a quadrature coil with further resonator systems for additional nuclei. These additional resonators may also be normally conducting without influencing the quality factor of the inner resonator system. Moreover, a gradient system which generates static field gradients in x, y and z direction can be mounted without RF shielding.

Figure 11:
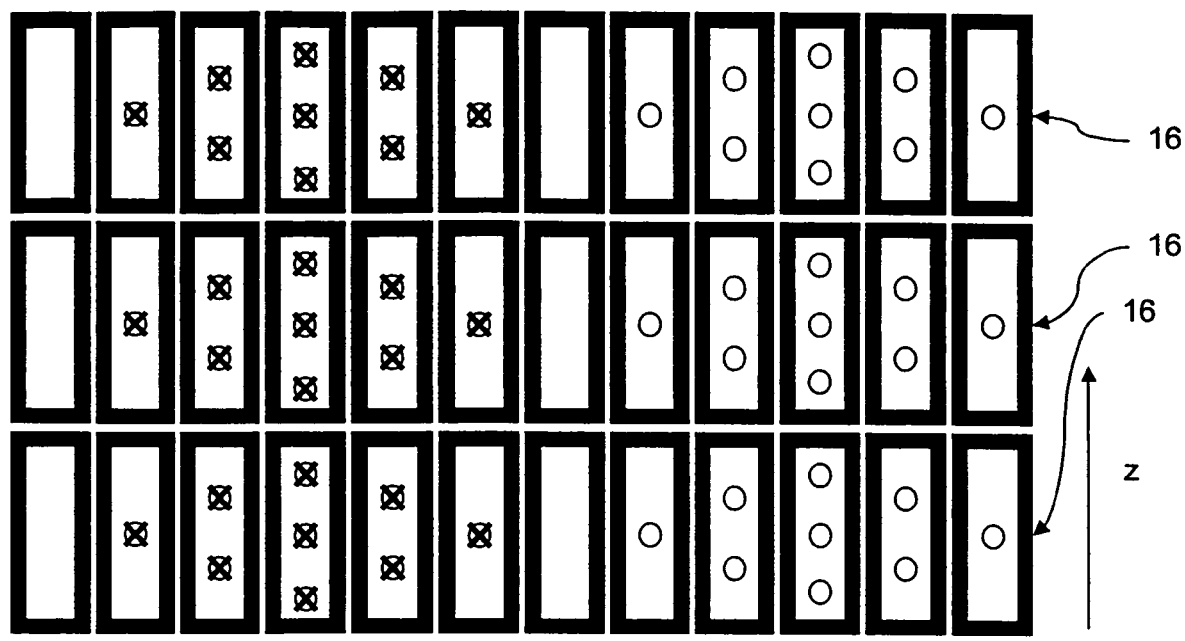
FIG. 11 shows an unwound view of a composite resonator consisting of several resonator systems stacked in the z-direction in accordance with the present invention with schematically shown magnetic field directions.

This principle of combining individual resonators 2 also facilitates very large resonator systems, i.e. "composite resonators" using relatively small substrates 1 (e.g. for MRI). FIG. 11 shows an "unrolled" composite resonator system which consists of several resonator systems 16 which are stacked in the z-direction with schematically shown magnetic field directions. Several resonator systems 16 (see FIG. 6) are stacked in the z-direction and the effective size of the "composite resonator system" can be arbitrarily increased. If the separation between the conductors with mutually compensating currents is small compared to the separation between the conductors and the sample to be measured, the resulting field distortions can be neglected. In this manner, a Birdcage for MRI measurements of an entire body or head can, in principle, be completely constructed from HTS on 2–3 inch wafers.

Figure 12A:
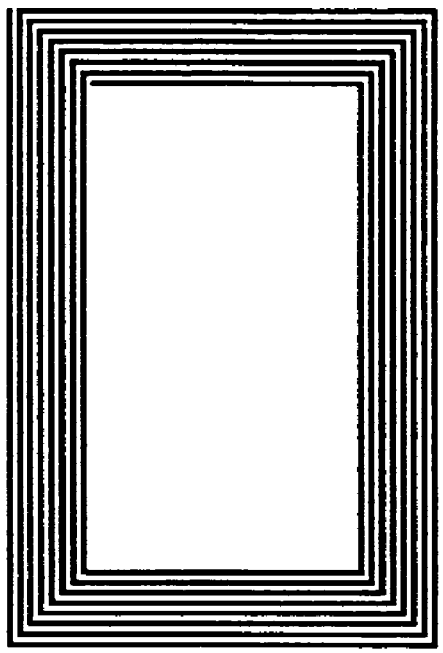
FIGS. 12a–d show individual resonator shapes in accordance with prior art.
Figure 12B:
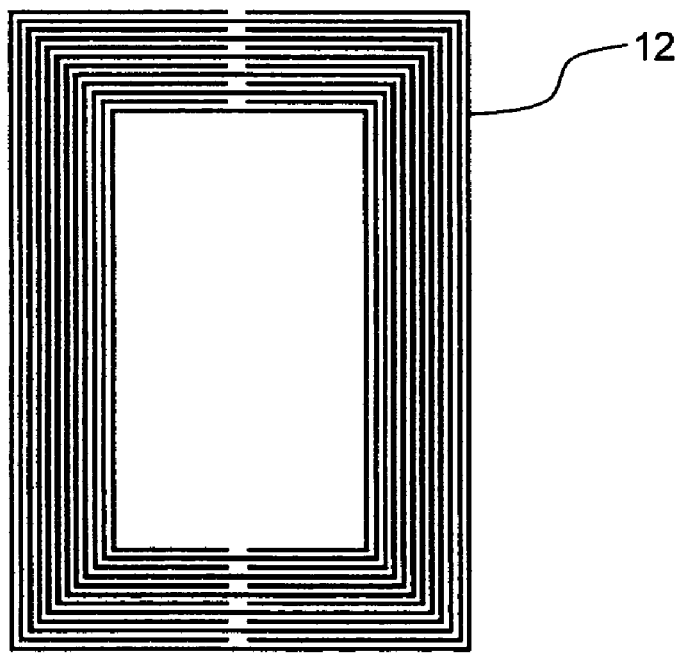
Figure 12C:
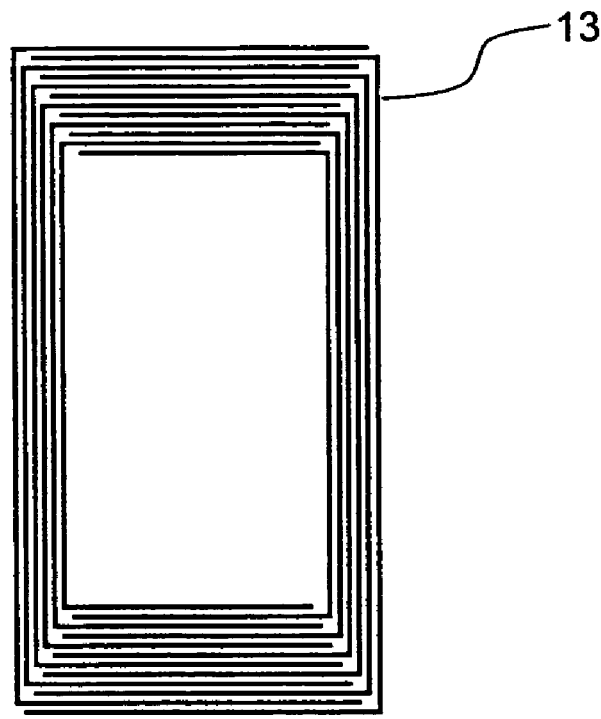
Figure 12D:
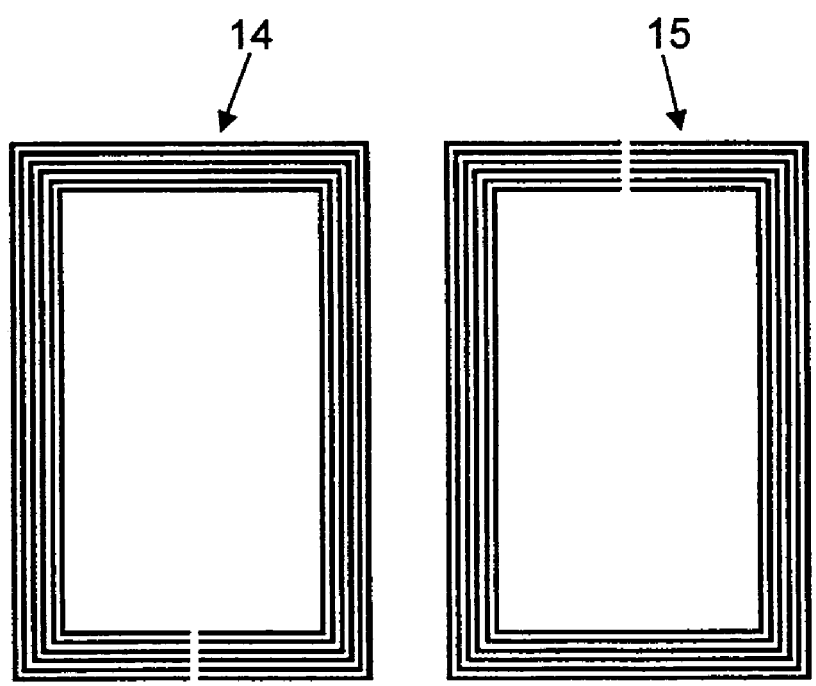
Figure 13:
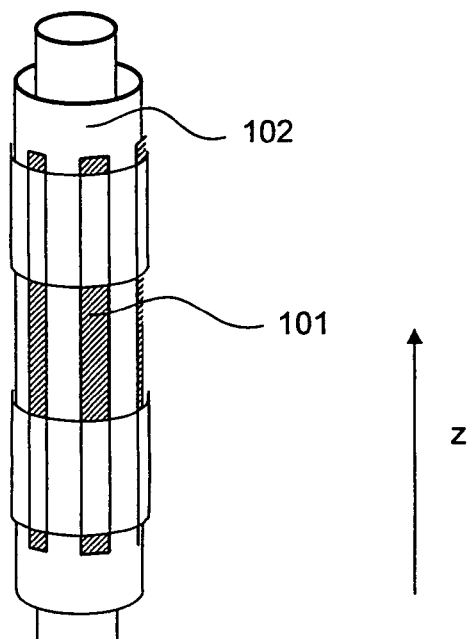
FIG. 13 shows a hybrid birdcage coil according to prior art.
Figure 14:
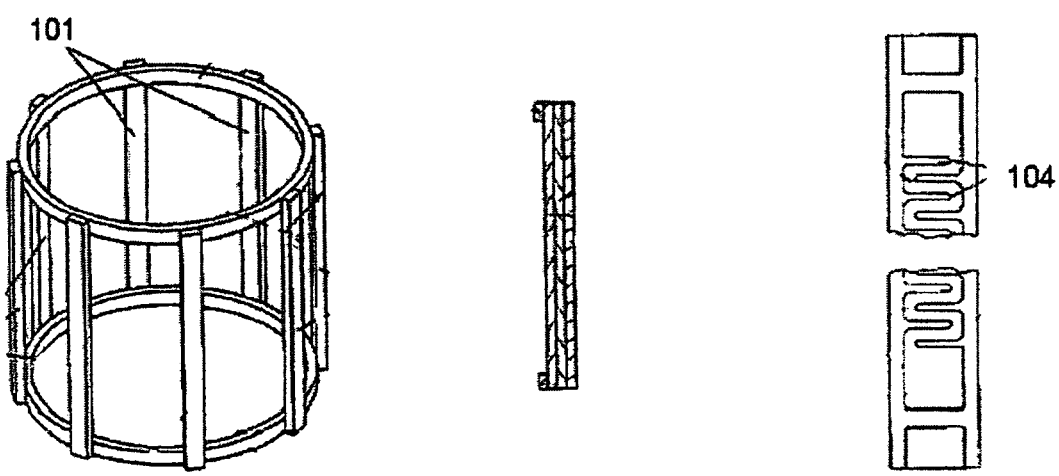
FIG. 14 shows a birdcage coils with meandering stripe structures in accordance with prior art.

All conventional resonators can be used as individual resonators. FIGS. 12a–d show examples of the most common geometries. FIG. 12a shows a spiral resonator which is suited, in particular, for lower frequencies. FIG. 12b shows a resonator with distributed capacitances which is composed of a plurality of conductor elements 12. In a resonator with localized capacitances (FIG. 12c), the U-shaped conductor elements 13 are nested and have a uniformly outwardly increasing overlapping region. A variant of a resonator with distributed capacitances is a coil on a substrate which is coated on both sides. FIG. 12d shows the upper side 14 and lower side 15 of such a substrate which is coated on both sides with HTS material.

The advantages of the inventive resonator system are excellently utilized if individual superconducting resonators (e.g. of YBCO) are used, since the losses would otherwise increase excessively due to the effective currents in the conductors which are approximately three times as high. Individual resonators produced from superconducting material are usually provided with a normally conducting quench protection layer. This layer is generally a noble metal layer (Ag, Au, . . . ) which is disposed on the superconductor before structuring. It serves as a normally conducting parallel path (shunt) in case of a quench and also permits adjustment of the quality factor of the resonator to reasonable values of approximately 20–30000 through adjusting its conductivity (thickness, material, etc.). Moreover, infrared radiation is reflected and not absorbed due to the high reflection coefficient.

The surface resistance of YBCO is sufficiently small at the preferably used frequencies, in the range between 100 MHz–1 GHz, that pure HTS resonators have a quality factor of approximately ½ million. This is much too high for NMR. To obtain reasonable excitation and receiving widths, quality factors of more than 20–30000 cannot be reasonably utilized. A coil produced "merely" from superconductors is therefore reduced to these quality factors. A hybrid coil, however, can hardly achieve these values. Its values are between 6000–12000—mainly determined by the conductivity of the normal conductor.

The present resonator system can consequently improve the signal-to-noise ratio with respect to a hybrid BC coil by a factor of approximately 1.5–2 (mainly through increasing the quality factor). The same applies for a Helmholtz pair of planar superconducting resonators having an efficiency improved by a factor of approximately 2–3 for the same quality factor, producing a S/N which is improved by a factor of 1.5.

In conclusion, it can be stated that a resonator system having an improved field homogeneity with full quadrature suitability, high quality factor and large efficiency can be realized in a straightforward manner with the structure of the inventive resonator system with individual resonators disposed on flat substrates whose individual RF field extends through a window of the individual resonator, wherein the symmetry planes of the remote R field and of the useful RF field are not or only slightly mutually rotated. Moreover, the inventive resonator system can produce nearly any desired spatial field distribution. The present resonator system thereby solves all known problems of superconducting magnetic resonance coils.

LIST OF LITERATURE

[1] Wong et al. U.S. 6590394 B2
[2] Withers U.S. 6556013 B2
[3] Brey et al. U.S. 5619140 A
[4] Brey et al. U.S. 5594342 A
[5] Withers U.S. 5585723 A
[6] Brey et al U.S. 5565778 A
[7] Withers et al U.S. 5351007 A
[8] Withers et al U.S. 5276398
[9] Marek U.S.2002190715
[10] Marek U.S. 6121776
[11] Wong et al. U.S. 6377047

| | List of Reference Numerals |
|---|---|
| 1 | substrate |
| 2 | individual resonator |
| 3 | field lines |
| 4a, b | currents in (+) and (−) directions, respectively |
| 5a, b | conductor section |
| 6 | remote RF field |
| 7 | useful RF field |
| 8 | window |
| 9 | compensation coils |
| 10 | upper edge |
| 11 | lower edge |
| 12 | conductor elements |
| 13 | U-shaped conductor elements |
| 14 | upper side of a coated substrate |
| 15 | lower side of a coated substrate |

| | -continued |
|---|---|
| | List of Reference Numerals |
| 10 | conductor path |
| 102 | tubular element |
| 103 | bars |
| 104 | meandering conductor structures |
| 105 | individual resonators |
| 106 | capacitance between the electrodes of an individual resonator |
| 107 | capacitance between two neighboring individual resonators |
| 108 | air/vacuum gap |
| 109 | conductor |
| 110 | substrate |
| 111 | individual resonators |
| 112 | volume under investigation |
| 113 | component |
| 114 | field generated by the current (+) |
| 115 | field generated by the counter current (−) |
| 116 | conductor |
| 117 | remote RF field |
| 118 | useful RF field |

I claim:

1. A resonator system for generating a radio frequency (RF) magnetic field in a volume under investigation of a magnetic resonance (MR) apparatus, the resonator system comprising:

a number N of individual flat resonators containing superconducting materials, surrounding volume under investigation, and each being disposed on a flat dielectric substrate about and parallel to a z-axis, each individual resonator having a window through which one individual RF field is generated in the volume under investigation in single operation of the respective individual resonator, said individual resonators cooperating to generate a useful RF field in the volume under investigation, said resonators also generating an asymptotic, remote RF field far outside of the resonator system, wherein a spatial configuration of said individual resonators as well as a dependence of said useful RF field are substantially mirror-symmetrical relative to a first plane A which contains the z-axis, and a spatial distribution of said asymptotic remote RF field is also substantially mirror-symmetrical relative to said first plane A, said useful RF field extending substantially parallel to said first plane A in the volume under investigation, wherein said individual resonators only have 2-fold rotational symmetry about the z-axis, all substrate planes of said individual resonators differing within a partial region defined and subdivided by said first plane A, wherein a number of individual resonators N>4 and, during operation of the resonator system, a substrate plane of at least one individual resonator subtends an angle of more than 40° with respect to a direction of said useful RF field in the volume under investigation.

2. The resonator system of claim 1, wherein said individual resonators are exclusively produced from superconducting material except for said dielectric substrates and an optional normally conducting metallic quench protection layer.

3. The resonator system of claim 1, wherein said individual resonators are disposed on surfaces of a polyhedron.

4. The resonator system of claim 1, wherein said individual resonators are disposed such that surface normals of said substrates have a tangential component.

5. The resonator system of claim 4, wherein said individual resonators are disposed radially outwardly like a star such that surface normals of said substrates are tangentially oriented.

6. The resonator system of claim 1, wherein said individual resonators comprise at least one of spiral resonators, resonators with distributed capacitances, resonators with localized capacitances, and double-sided resonators.

7. The resonator system of claim 1, wherein several individual resonators are disposed along the z-direction for active shielding of the generated RF magnetic field in the z-direction and/or wherein several individual resonators are nested in a radial direction in an xy-plane perpendicular to the z-direction for active shielding of the generated RF magnetic field.

8. The resonator system of claim 1, wherein several substrates are provided with one or more individual resonators and are stacked or nested in the z-direction and/or in a radial direction.

9. The resonator system of claim 1, wherein at least one of said individual resonators has a resonance frequency which differs from that of other said individual resonators.

10. The resonator system of claim 1, wherein said individual resonators are inductively, and/or capacitively, and/or galvanically coupled.

11. A resonator system comprising a combination of the resonator system of claim 1, with a conventional normally conducting and/or superconducting individual resonators and/or resonator systems.

12. A method for adjusting eigen-resonances of individual resonators of the resonator system of claim 1, the method comprising the steps of:
a) designing a resonator system;
b) calculating currents $I_0$ that permit maximum field homogeneity in a volume under investigation for a given geometrical arrangement of individual resonators;
c) calculating a current distribution in the resonator system and a magnetic field in the volume under investigation for a desired resonance mode;
d) calculating average currents in conductor elements of individual resonators;
e) correcting the eigen-resonances of the individual resonators, wherein changes are substantially proportional to a respective deviation of the currents from the currents $I_0$ calculated in step b); and
f) repeating steps b) through e) until a homogeneity of a useful RF field in the volume under investigation is maximized.

13. A resonator system for generating a radio frequency (RF) magnetic field In a volume under investigation of a magnetic resonance (MR) apparatus, the resonator system comprising:
a number N of individual resonators which surround the volume under investigation and which are each disposed, about a z-axis, on a flat dielectric substrate, each individual resonator having a window through which one individual RF field is generated in the volume under investigation in single operation of the respective individual resonator, said individual resonators cooperating to generate a useful RF field in the volume under investigation, said resonators also generating an asymptotic, remote RF field far outside of the resonator system, wherein a spatial distribution of said useful RF field is substantially mirror-symmetrical relative to a first plane A which contains the z-axis, and a spatial distribution of said asymptotic remote RF field is substantially mirror-symmetrical relative to a second plane B which contains the z-axis, said useful RF field extending substantially parallel to said first plane A in the volume under investigation, wherein a number of individual resonators N>4 and, at at least one point in time during operation of the resonator system, a substrate plane of at least one individual resonator subtends an angle of more than 40° with respect to a direction of said useful RF field in the volume under investigation, wherein said first plane A is not rotated about the z-axis relative to said second plane B or is rotated about the z-axis relative to said second plane B by less than 360°/(N+1) and wherein said individual resonators comprise at least one of spiral resonators, resonators with distributed capacitances, resonators with localized capacitances, and double-sided resonators.

14. The resonator system of claim 13, wherein said individual resonators contain superconducting material and/or are exclusively produced from superconducting material except for said dielectric substrates and an optional normally conducting metallic quench protection layer.

15. The resonator system of claim 13, wherein said number N of said individual resonators is $N=2(i+2)$, or $N=4(i+1)$, wherein i is a natural number.

16. The resonator system of claim 13, wherein said individual resonators are disposed in 2-fold, 4-fold or N-fold rotational symmetry about the z-axis.

17. The resonator system of claim 13, wherein at least one of said individual resonators has a resonance frequency which differs from that of other said individual resonators.

18. The resonator system of claim 17, wherein the resonator system has two linearly polarized modes with different frequencies.

19. The resonator system of claim 13, wherein said individual resonators are inductively, and/or capacitively, and/or galvanically coupled.

20. A resonator system for generating a radio frequency (RF) magnetic field in a volume under investigation of a magnetic resonance (MR) apparatus, the resonator system comprising:
a number N of individual resonators which surround the volume under investigation and which are each disposed, about a z-axis, on a flat dielectric substrate, each individual resonator having a window through which one individual RF field is generated in the volume under investigation in single operation of the respective individual resonator, said individual resonators cooperating to generate a useful RF field in the volume under investigation, said resonators also generating an asymptotic, remote RF field far outside of the resonator system, wherein a spatial distribution of said useful RF field is substantially mirror-symmetrical relative to a first plane A which contains the z-axis, and a spatial distribution of said asymptotic remote RF field is substantially mirror-symmetrical relative to a second plane B which contains the z-axis, said useful RF field extending substantially parallel to said first plane A in the volume under investigation, wherein a number of individual resonators N>4 and, at at least one point in time during operation of the resonator system, a substrate plane of at least one individual resonator subtends an angle of more than 40° with respect to a direction of said useful RF field in the volume under investigation, wherein said first plane A is not rotated about the z-axis relative to said second plane B or is rotated about the z-axis relative to said second plane B by less than 360°/(N+1); and a conventional normally conducting and/or superconducting individual resonators and/or resonator systems.

21. The resonator system of claim 20, wherein said individual resonators contain superconducting material and/or are exclusively produced from superconducting material except for said dielectric substrates and an optional normally conducting metallic quench protection layer.

22. The resonator system of claim 20, wherein said individual resonators or groups of said individual resonators are disposed in 2-fold, 4-fold or N-fold rotational symmetry about the z-axis.

23. The resonator system of claim 20, wherein said number N of said individual resonators is N=2(i+2) or N=4(i+1), wherein i is a natural number.

24. The resonator system of claim 20, wherein said individual resonators are inductively, and/or capacitively, and/or galvanically coupled.

* * * * *